(12) United States Patent
Young et al.

(10) Patent No.: US 10,882,474 B2
(45) Date of Patent: Jan. 5, 2021

(54) ELECTRICAL POWER SYSTEM FOR A VEHICLE (71) Applicant: GE Global Sourcing LLC, Norwalk, CT (US)

(72) Inventors: Henry Todd Young, Erie, PA (US); Fabio Carastro, Munich (DE); Mark Murphy, Erie, PA (US); Jason Kuttenkuler, Erie, PA (US); Alvaro Jorge Mari Curbelo, Oberschleissheim (DE)

(73) Assignee: Transportation IP Holdings, LLC, Norwalk, CT (US)

( * ) Notice: Subject to any disclaimer, the term of this patent is extended or adjusted under 35 U.S.C. 154(b) by 2 days.

(21) Appl. No.: 16/431,382

(22) Filed: Jun. 4, 2019

(65) Prior Publication Data
US 2019/0366951 A1 Dec. 5, 2019

Related U.S. Application Data (60) Provisional application No. 62/680,265, filed on Jun. 4, 2018.

(51) Int. Cl.
*H02M 7/00* (2006.01)
*H02M 7/537* (2006.01)
(Continued)

(52) U.S. Cl.
CPC ........... *B60R 16/0231* (2013.01); *H01G 4/38* (2013.01); *H02G 5/005* (2013.01); *H02G 5/10* (2013.01); *H02M 7/003* (2013.01); *H02M 7/48* (2013.01); *H02M 7/537* (2013.01); *H05K 7/209* (2013.01); *H05K 7/20854* (2013.01)

(58) Field of Classification Search
None
See application file for complete search history.

(56) References Cited

U.S. PATENT DOCUMENTS 4,399,321 A    8/1983   Gottlieb
4,436,953 A    3/1984   Gottlieb
(Continued)

OTHER PUBLICATIONS

SEB Inc. PCIM Paper Presentation: 20% Increase in Inverter Efficiency Seen with Integrated DC Link Capacitor/BUS (2 pages).

*Primary Examiner* — An T Luu
(74) *Attorney, Agent, or Firm* — Christopher R. Carroll; The Small Patent Law Group LLC (57) ABSTRACT

A vehicle electrical power system includes a phase module assembly of a multi-phase inverter. The phase module assembly includes first and second flat laminated busbars extending in orthogonal planes. The phase module assembly also includes one or more transistors that convert direct current into one phase of a multi-phase alternating current of the multi-phase inverter, and to output the phase of the multi-phase alternating current to the load. The phase module assembly also includes one or more capacitors conductively coupled with the internal positive and negative terminal connectors and with the external positive and negative bushings configured to be conductively coupled with the power source of direct current. The assembly can be useful for vehicles because the components of the system are configured to carry large amounts of current in a more reliable and sustainable manner.

18 Claims, 7 Drawing Sheets

(51) Int. Cl.
*H02M 7/08* (2006.01)
*H02G 5/00* (2006.01)
*H01G 4/38* (2006.01)
*B60R 16/023* (2006.01)
*H02G 5/10* (2006.01)
*H05K 7/20* (2006.01)
*H02M 7/48* (2007.01)

(56) References Cited

U.S. PATENT DOCUMENTS

| | | | |
|---|---|---|---|
| 5,142,439 A | 8/1992 | Huggett et al. | |
| 6,456,516 B1 * | 9/2002 | Bruckmann | H02M 7/003 363/144 |
| 8,112,853 B2 | 2/2012 | Yoshinaga et al. | |
| 8,480,419 B2 * | 7/2013 | Holbrook | B60R 25/00 439/213 |
| 9,538,680 B2 * | 1/2017 | Li | H02M 7/487 |
| 10,008,953 B2 * | 6/2018 | Kamizuma | H02M 7/217 |
| 2019/0372473 A1 * | 12/2019 | Young | H02M 7/48 |

\* cited by examiner

ELECTRICAL POWER SYSTEM FOR A VEHICLE

CROSS-REFERENCE TO RELATED APPLICATIONS

This application claims priority to U.S. Provisional Application No. 62/680,265, which was filed 4 Jun. 2018, and the entire disclosure of which is incorporated herein by reference.

FIELD

Embodiments of the subject matter disclosed herein generally relate to electric power systems for vehicles.

BACKGROUND

Inverters convert direct current (DC) into alternating current (AC). Some inverters include multiple phase modules that each convert a portion of the DC into a different phase of the AC. For example, some inverters include three phase modules that each create a different phase of AC (for 3-phase AC power).

Some vehicle power systems include inverters that power significant loads. For example, some vehicles may include inverters that power traction motors that propel the vehicles. These inverters generate heat during operation, and some known inverters are air cooled, having either capacitors integrated into standalone inverter modules or a bank of capacitors connected to a laminated bus structure (which then connects to phase modules to form the inverter). In either situation, the capacitors may be fitted with separation caps that take up significant volume and weight. Additionally, the busbars of these systems can take up significant volume and weight.

BRIEF DESCRIPTION

In one embodiment, a vehicle is provided that includes a chassis or hull, and a vehicle electrical power system operably disposed onboard the chassis or hull. The power system includes a vehicle electrical load that comprises at least one of a vehicle motor or a braking resistor. The power system also includes a phase module assembly of a multi-phase inverter. The phase module assembly includes a first flat laminated busbar elongated along a first direction, including a positive layer, a negative layer, and a load layer configured to be conductively coupled with the load. The first flat laminated busbar includes internal positive and negative terminal connectors for connecting the first flat laminated busbar to a second laminated flat busbar. The second laminated flat busbar includes positive and negative layers extending in a plane that is orthogonal to the first direction of the first laminated flat busbar. The second laminated flat busbar includes external positive and negative bushings configured to be conductively coupled with a power source of direct current. The internal positive and negative terminal connectors are conductively coupled with the external positive and negative bushings to receive the direct current from the power source. The phase module assembly also includes one or more insulated gate bipolar transistors conductively coupled with the internal positive and negative terminal connectors and configured to convert the direct current into one phase of a multi-phase alternating current of the multi-phase inverter, and to output the phase of the multi-phase alternating current to the load. The phase module assembly also includes one or more capacitors conductively coupled with the internal positive and negative terminal connectors and with the external positive and negative bushings configured to be conductively coupled with the power source of direct current.

In one embodiment, a vehicle power supply system includes plural phase module assemblies each including a first flat laminated busbar elongated along a first direction, including a positive layer, a negative layer, and a load layer configured to be conductively coupled with a vehicle load. The first flat laminated busbar includes internal positive and negative terminal connectors for connecting the first flat laminated busbar to a second laminated flat busbar. The second laminated flat busbar includes positive and negative layers extending in a plane that is orthogonal to the first direction of the first laminated flat busbar. The second laminated flat busbar includes external positive and negative bushings configured to be conductively coupled with a vehicle power source of direct current. The internal positive and negative terminal connectors are conductively coupled with the external positive and negative bushings to receive the direct current from the power source. The phase module assemblies also include one or more insulated gate bipolar transistors conductively coupled with the internal positive and negative terminal connectors and configured to convert the direct current into one phase of a multi-phase alternating current of the multi-phase inverter, and to output the phase of the multi-phase alternating current to the load. The phase module assemblies also include one or more capacitors conductively coupled with the internal positive and negative terminal connectors and with the external positive and negative bushings configured to be conductively coupled with the power source of direct current. The phase module assemblies are conductively coupled with the power source to separately receive different portions of the direct current and to separately generate different phases of the multi-phase alternating current for the load.

In one embodiment, a vehicle power supply system includes plural phase module assemblies each including a first flat laminated busbar elongated along a first direction, including a positive layer, a negative layer, and a load layer configured to be conductively coupled with a vehicle load. The first flat laminated busbar includes internal positive and negative terminal connectors for connecting the first flat laminated busbar to a second laminated flat busbar. The second laminated flat busbar includes positive and negative layers extending in a plane that is orthogonal to the first direction of the first laminated flat busbar. The second laminated flat busbar includes external positive and negative bushings configured to be conductively coupled with a vehicle power source of direct current. The internal positive and negative terminal connectors are conductively coupled with the external positive and negative bushings to receive the direct current from the power source. The phase module assemblies also include one or more insulated gate bipolar transistors conductively coupled with the internal positive and negative terminal connectors and configured to convert the direct current into one phase of a multi-phase alternating current of the multi-phase inverter, and to output the phase of the multi-phase alternating current to the load. The phase module assemblies also include one or more capacitors conductively coupled with the internal positive and negative terminal connectors and with the external positive and negative bushings configured to be conductively coupled with the power source of direct current. The phase module assemblies are conductively coupled with the power source to separately receive different portions of the direct current and to separately generate different phases of the multi-phase alternating current for the load. The phase module assemblies also include a joining busbar connecting the phase module assemblies and configured to be conductively coupled with one or more bulk capacitors and one or more external cables of the power source.

BRIEF DESCRIPTION OF THE DRAWINGS

The presently described subject matter will be better understood from reading the following description of non-limiting embodiments, with reference to the attached drawings, wherein below.

DETAILED DESCRIPTION

The inventive subject matter described herein provides a more compact and lightweight air-cooled traction inverter system for loads such as heavy duty vehicles. Not all embodiments of the inventive subject matter described herein is limited to heavy duty vehicles. One or more embodiments of the inverter systems described herein can be used to power propulsion systems (e.g., motors) of a variety of vehicles, such as traction motors of rail vehicles (e.g., locomotives), traction motors of automobiles, motors that rotate propellers of marine vessels, traction motors of mining vehicles, motors of other off-highway vehicles (e.g., vehicles that are not legally permitted and/or are not designed for self-propulsion along public roadways), etc.

The inverters described herein can utilize capacitors that are integrated into a laminated busbar to form the DC link for a set of phase module assemblies of the inverter, which can be configured to make up two or more inverter and/or chopper functions. The phase module assemblies reduce commutation inductance and achieve higher power densities of a multiple inverter structure connected to a distributed DC link arrangement, while remaining reliable. The phase module assemblies also can improve switching performances of silicon (Si) and silicon carbide (SiC) high-power modules used in high power drives and grid connected power inverters.

Figure 1:
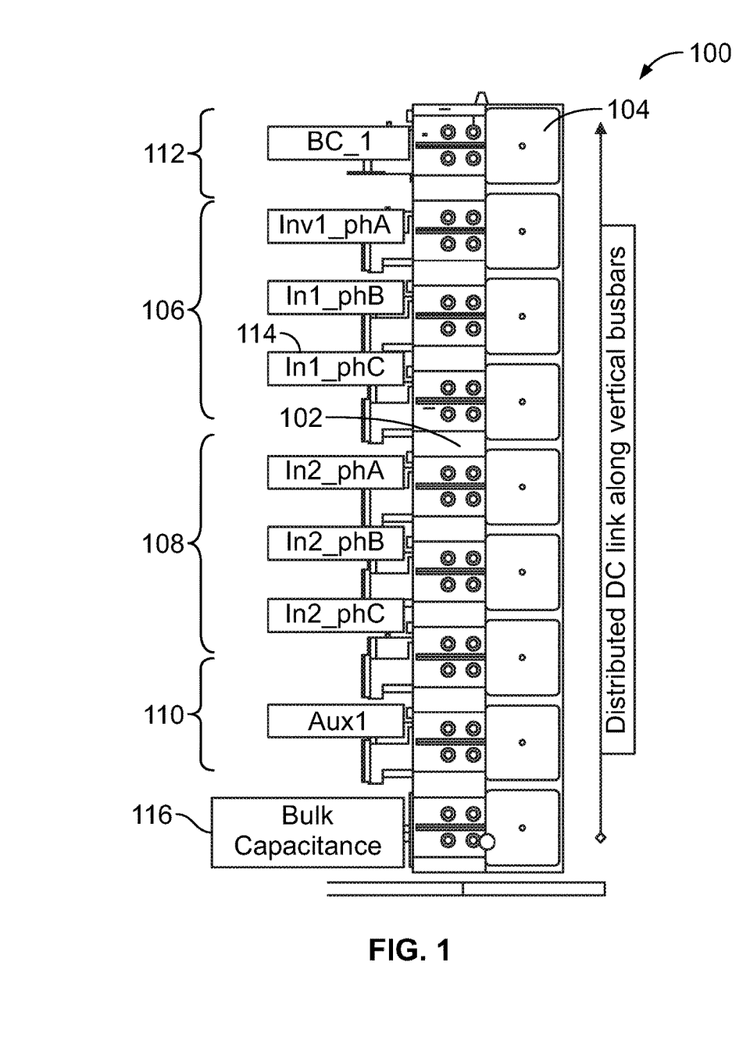
FIG. 1 is a schematic illustration of one embodiment of an inverter stack assembly.

FIG. 1 is a schematic illustration of one embodiment of an inverter stack assembly 100 of a vehicle. The inverter stack assembly includes a single DC link busbar 102 with integrated capacitors 104. The inverter stack assembly can be used in a powered system, such as a vehicle, to power loads such as traction motors. The inverter stack assembly includes the single DC link busbar with nine integrated capacitors that supply two multi-phase inverter assemblies 106, 108, an auxiliary inverter assembly 110 ("Aux1" in FIG. 1), and a chopper 112 ("BC_1" in FIG. 1). Each of the inverter assemblies can be a three-phase inverter with plural (e.g., three) phase module assemblies 114.

The phase module assembly of the first inverter assembly that is labeled Inv1_phA can produce a first phase of AC to a first load (e.g., a traction motor), the phase module assembly of the first inverter assembly that is labeled Inv1_phB can produce a second phase of AC to the first load, and the phase module assembly of the first inverter assembly that is labeled Inv1_phC can produce a third phase of AC to the first load.

Similarly, the phase module assembly of the second inverter assembly that is labeled Inv1_phA can produce a first phase of AC to a second load (e.g., another traction motor), the phase module assembly of the second inverter assembly that is labeled Inv1_phB can produce a second phase of AC for the second load, and the phase module assembly of the second inverter assembly that is labeled Inv1_phC can produce a third phase of AC for the second load. In one embodiment, the chopper may be a brake chopper of a vehicle. The auxiliary inverter assembly may generate AC for loads that do work other than propelling the vehicle. A bulk capacitor 116 optionally can be included to increment the total capacitance and current capability of the stack of inverter assemblies. The bulk capacitor can be one or more capacitors that are conductively coupled with multiple phase module assemblies and/or are connected across the DC supply lines of one or more (or all) of the inverter assemblies.

Figure 2:
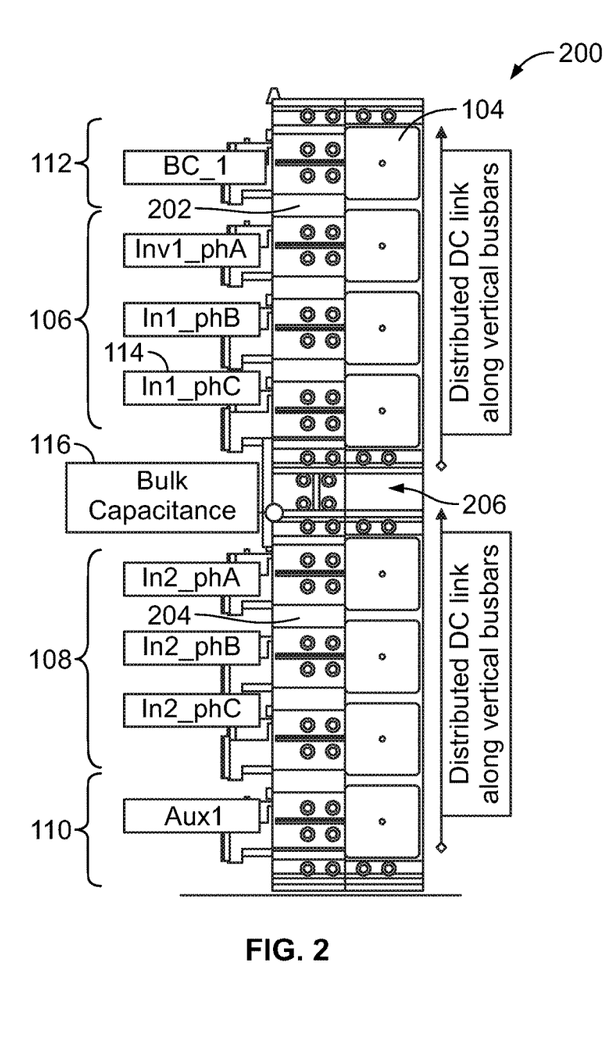
FIG. 2 is a schematic illustration of another embodiment of an inverter stack assembly.

FIG. 2 is a schematic illustration of another embodiment of an inverter stack assembly 200. The inverter stack assembly 200 includes two DC link busbars 202, 204 that are connected by a joining busbar 206, where each of the busbars 202, 204 includes four integrated capacitors 104, and that supply DC current to the inverter assemblies 106, 108, the auxiliary inverter assembly 110, and the chopper 112. The joining busbar 206 may be an interconnecting lamination (e.g., a laminated busbar) in one embodiment. The bulk capacitor 116 is located between the inverter assemblies 106, 108 and between the busbars 202, 204, and is connected to the busbars 202, 204 using a low inductive laminated connection. The bulk capacitor 116 also provides an electrical link to the vertical bus 202, 204.

The inverter stack assembly shown in FIG. 2 may be more modular than the inverter stack assembly shown in FIG. 1 (e.g., additional phase module assemblies can be easily attached to the busbars 202, 204), may be easier to manufacture than the inverter stack assembly shown in FIG. 1 (e.g., due to the modular nature), may be easier to transport than the inverter stack assembly shown in FIG. 1 (e.g., due to the modular nature, the inverter stack assembly shown in FIG. 2 may be taken apart and re-assembled more easily than the inverter stack assembly shown in FIG. 1), may be lighter for individual components relative to the inverter stack assembly shown in FIG. 1, and may have a simpler assembly process than the inverter stack assembly shown in FIG. 1.

Figure 3:
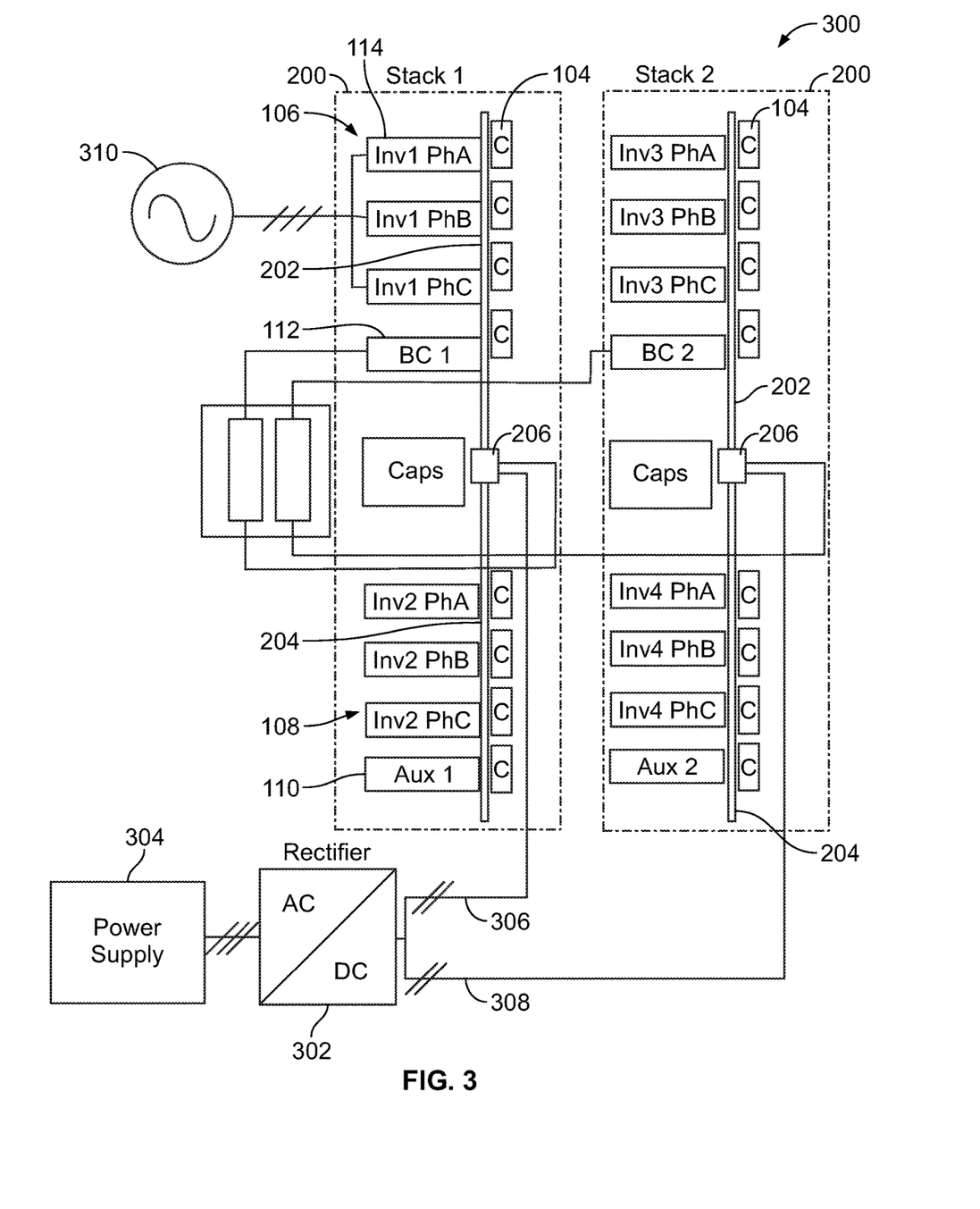
FIG. 3 illustrates a circuit diagram of a power supply system.

FIG. 3 illustrates a circuit diagram of an electrical power system 300 of a vehicle. The power system 300 includes two of the inverter stack assemblies 200 shown in FIG. 2 ("Stack 1" and "Stack 2" in FIG. 3). A rectifier 302 is fed from a multi-phase AC power supply 304, such as a synchronous generator (not shown) or another type of power supply. The power supply provides a three phase AC current in the illustrated embodiment, but optionally can provide another AC current having at least two phases. The output of the rectifier (which could be a diode bridge or another component) is split into two sets of DC+/DC− feeding points 306, 308, each of which supplies a system of the laminated busbars 202, 204 (also shown in FIG. 2) arranged in two stacks, represented as vertical columns in FIG. 3. Horizontal dispositions and variations of the laminated busbars 202, 204 can be used in an alternative embodiment. The interconnection elements between the output and the rectifier could be a pair of cables, busbars, or other conductive bodies or pathways. The two stacks are receptacles for a number of the phase module assemblies (shown in FIG. 1), as shown in FIG. 3. Each of the inverter stack assemblies or at least one of the inverter stack assemblies shown in FIG. 2 can receive the DC current from the busbars.

In the illustrated embodiment, the multiple (e.g., three) phase AC that is output by at least one of the inverter assemblies (e.g., the inverter assembly in FIG. 3, but optionally can be another inverter assembly) can be provided to a load 310, such as a motor of a vehicle or another load. This multi-phase AC that is output to the load can power the load, such as by powering the motor to generate tractive effort at a wheel, axle, or the like, of the vehicle, by powering the motor to rotate a propeller of a marine vessel, or the like.

Each inverter stack assembly in FIG. 3 holds eight phase module assemblies, represented to the left of the respective stack assembly. The phase module assemblies are arranged in two sets of three contiguous phase module assemblies, which together form a three-phase inverter assembly. The left stack assembly is capable of feeding two three-phase AC loads, such as motors. There are two additional positions for housing phase module assemblies, in positions four (where the chopper is located) and eight (where the auxiliary inverter assembly is located), with the positions numbered in an order counting from the top.

In the illustrated embodiment, the phase module assembly 114 forming the chopper 112 of position four holds switches used to transfer power to a resistor (e.g., a grid box block), which can be used, for example, during braking of a vehicle or when excess voltage transiently appears in the system 300 which needs to be quickly dissipated. The phase module assembly 114 forming the auxiliary inverter assembly 100 in position eight can be used for some auxiliary function, such as driving another brake resistor, generating part of a chopped waveform to create a secondary bus at a different voltage level to feed additional inverter assemblies (not shown) used to drive auxiliary loads, or the like. Although eight phase module assemblies 114 are shown in each stack 200, more could be used in one or more of the stacks 200. In the illustrated embodiment, the two stacks 200 together allow up to four independent loads (e.g., motors) to be powered, such as traction motors of a four-wheeled vehicle.

Figure 4:
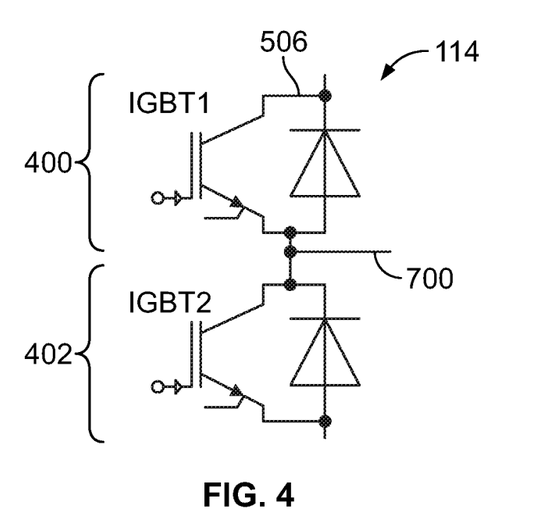
FIG. 4 illustrates a circuit diagram of one embodiment of a phase module assembly shown in FIGS. 2 and 3.
Figure 5:
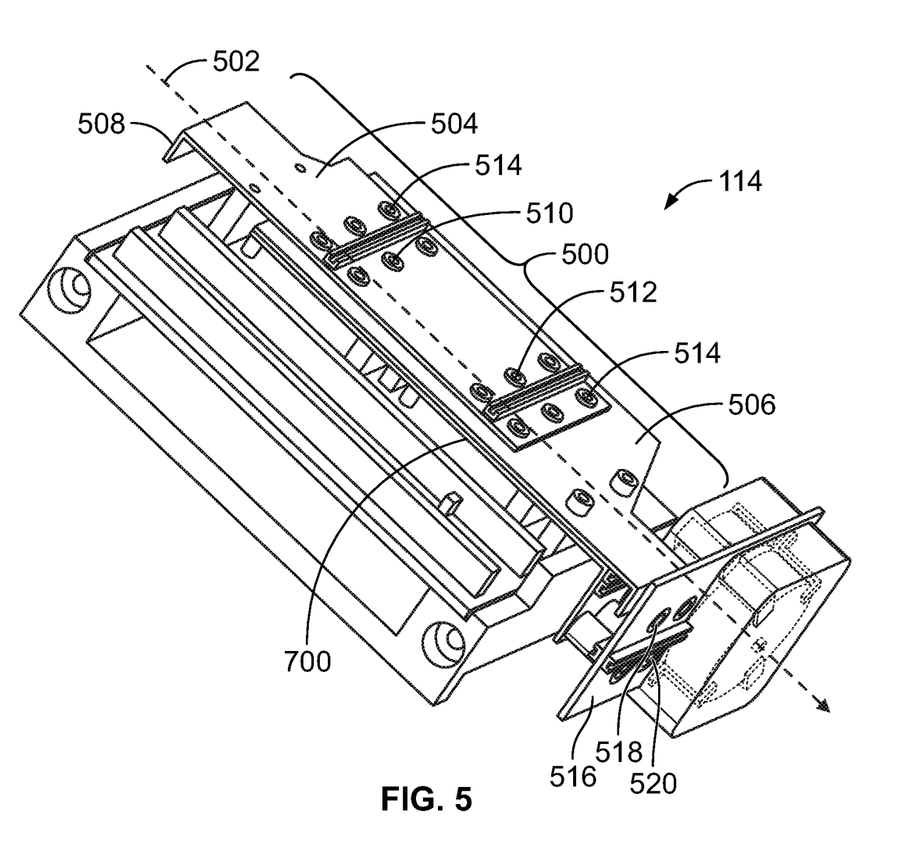
FIG. 5 illustrates a perspective view of one embodiment of the phase module assembly shown in FIGS. 2 through 4.

FIG. 4 illustrates a circuit diagram of one embodiment of the phase module assembly 114 shown in FIGS. 2 and 3. FIG. 5 illustrates a perspective view of one embodiment of the phase module assembly 114 shown in FIGS. 2 through 4. The phase module assembly 114 includes a series connection of multiple (e.g., two) switches 400, 402 ("IGBT1" and "IGBT2" in FIG. 4. Each switch 400, 402 can be a packaged insulative gate bipolar transistor (IGBT) with antiparallel diodes integrated in a housing, or another type of solid state, semiconductor-based device.

The phase module assembly 114 includes a first flat busbar 500 that is elongated along a first direction 502. For example, the busbar 500 may be planar or substantially planar (e.g., at least 75% of the busbar 500 lies within the same two-dimensional plane), and may be longer in the first direction 502 than any other direction. The busbar 500 can be formed from several conductive plates (or busbars) 504, 506, 700 that are laminated together, or may be formed as a single plate. As shown in FIG. 4, the busbar 506 can operate as or be conductively coupled with the collector of the IGBT 400. The busbar 700 can operate as or be conductively coupled with the emitter of the IGBT 400, and also with the collector of the IGBT 402. The plate 504 terminates in a downwardly bent conductive tab 508, which can be used to connect with a cable or other connection to the load 310 (such as a cable to a motor) to output the phase of the AC current created by the phase module assembly 114. As shown, the plates 504, 506 at least partially overlap each other, but may not entirely overlap each other.

The busbar 500 includes internal positive and negative terminal connectors or bushings 510, 512 and phase output terminal connectors or bushings 514. The connectors 510, 512, 514 are coupled with components internal to the phase module assembly 114, such as different parts of the switches 400, 402 forming the phase module assembly 114.

The phase module assembly 114 includes a second flat busbar 516 that is conductively coupled with the first flat busbar 500. The second flat busbar 516 extends in a plane that is orthogonal to the first direction 502 of the first flat busbar 500 and that is orthogonal to the plane in which the first flat busbar 500 extends. For example, as shown in FIG. 5, the busbars 500, 516 may extend in perpendicular planes. In one embodiment, the phase module assembly 114 is oriented such that the second busbar 516 is oriented vertically while the first busbar 500 is oriented horizontally. The second busbar 516 can be referred to as a vertical busbar and the first busbar 500 can be referred to as a horizontal busbar in such an orientation.

The busbar 516 includes external positive and negative bushings 518, 520. These bushings 518, 520 are configured to be conductively coupled with the power source 304, such as by being coupled with the busbar 202 or 204 to receive the DC. The internal positive and negative terminal connectors 510, 512 are conductively coupled with the external positive and negative bushings 518, 520 inside the busbars 500, 516 and other components of the assembly 114 (e.g., by conductive plates, traces, buses, or the like) so that the assembly 114 receives the DC from the power source 304, converts the DC into one phase of the multi-phase AC, and outputs the phase of the multi-phase AC to the load 310 (e.g., via the tab 508). In the illustrated embodiment, the bushings 518, 520 are symmetrically arranged on different parts of the same surface or side of the vertical busbar 516 (e.g., top and bottom portions of the side that is visible in FIG. 5).

Figure 6:
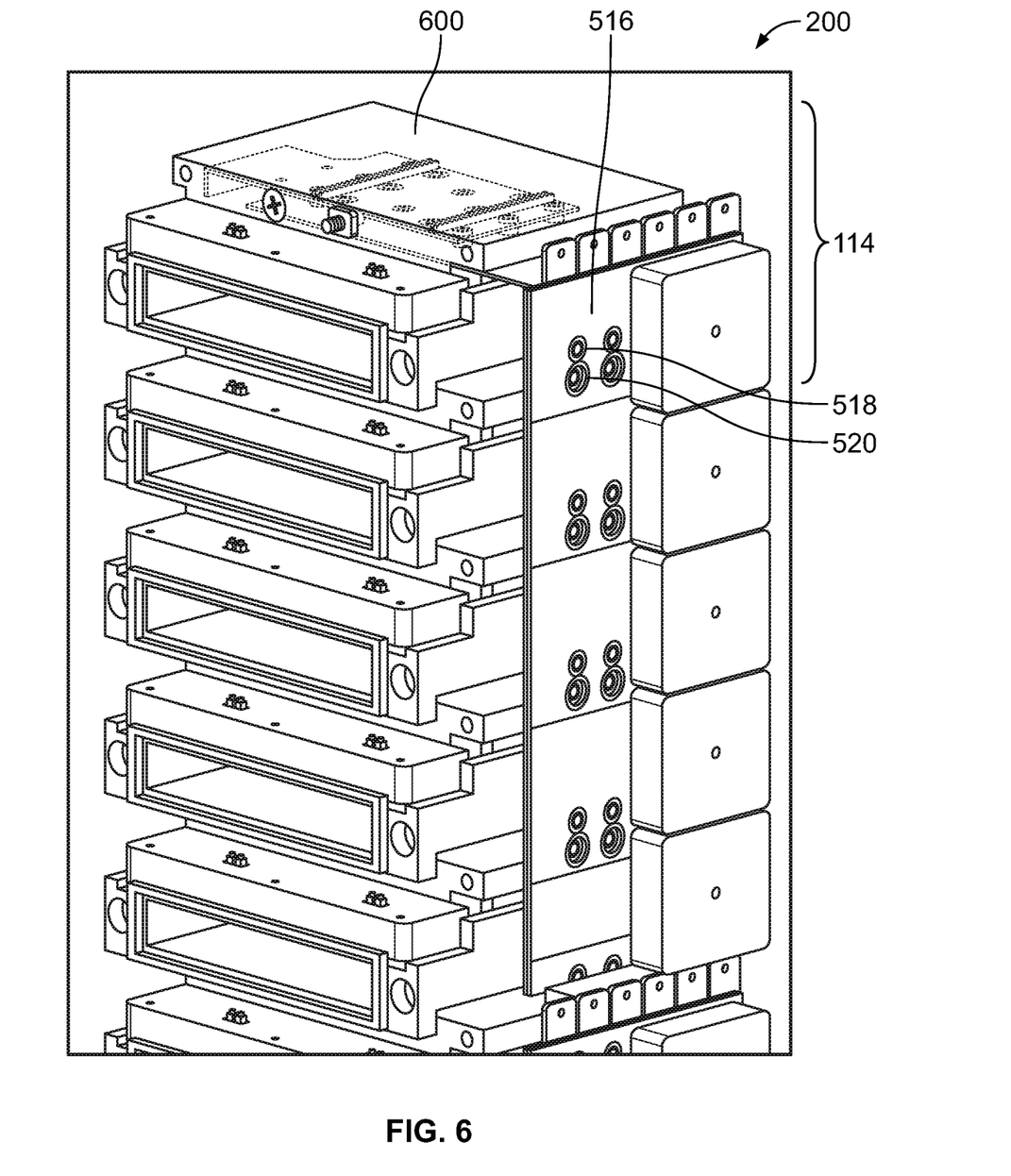
FIG. 6 illustrates a perspective view of the inverter stack assembly shown in FIG. 2.
Figure 7:
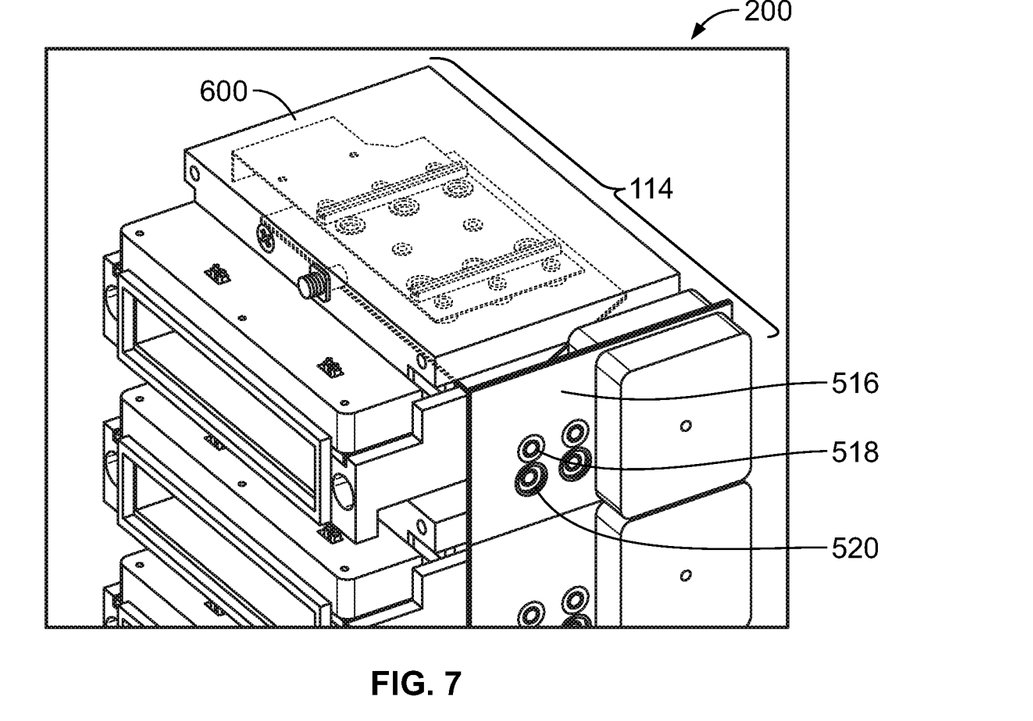
FIG. 7 illustrates a closer view of the top of the inverter stack assembly shown in FIG. 6.

With continued reference to the phase module assembly 114 shown in FIG. 5, FIG. 6 illustrates a perspective view of the inverter stack assembly 200 shown in FIG. 2 and FIG. 7 illustrates a closer view of the top of the inverter stack assembly 200 shown in FIG. 6. When viewed from the front (e.g., in FIGS. 5 and 6) the laminated phase module assembly 114 exits to the right of the stack 200, protrudes a certain distance, and is shaped outside the top of the switches toward the front right and ends in the bushings 518, 520 for DC+ and DC− (depending on the ampacity requirements of the system). The phase module assembly 114 can be enclosed inside an exterior housing 600. This can protect the phase module assembly 114 against the environment, dust, and other elements.

Figure 8:
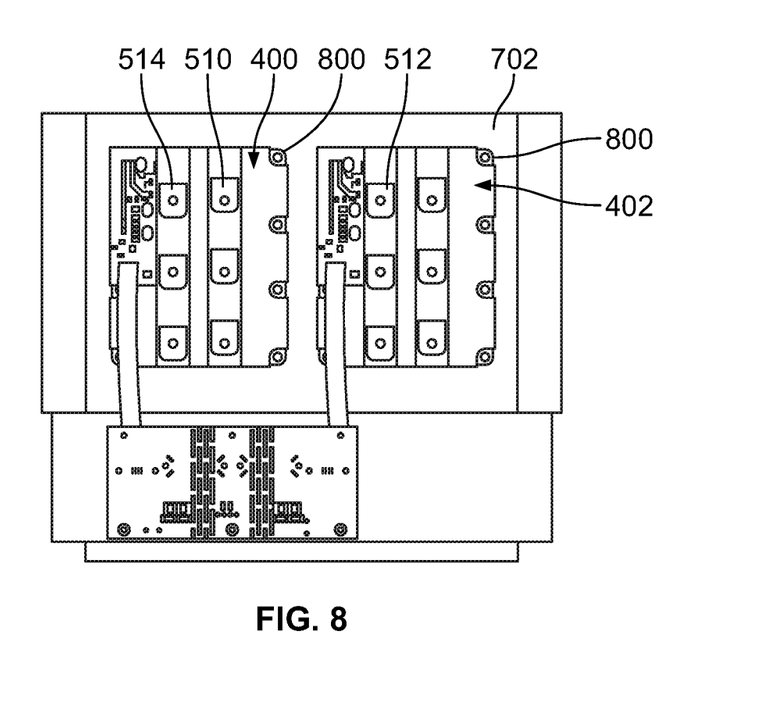
FIG. 8 illustrates a top view of one embodiment of plates of the phase module assembly shown in FIG. 1 connected with a heat sink.
Figure 9:
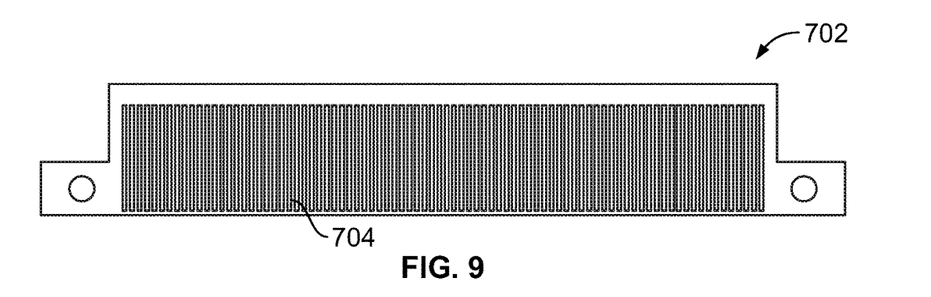
FIG. 9 illustrates a side view of the heat sink shown in FIG. 8.

In one embodiment, the phase module assembly 114 includes or is connected with a heat sink beneath the flat busbar 500 (e.g., in the perspective of FIGS. 4 through 6). FIG. 8 illustrates a top view of one embodiment of the switches 400, 402 of the phase module assembly 114 connected with a heat sink 702. FIG. 9 illustrates a side view of the heat sink 702 shown in FIG. 8. The switches 400, 402 can be IGBTs that are electrically connected to the terminals 512, 510 and the phase module busbar laminations, and are thermally connected through lower baseplates of the switches 400, 402 to a heat sink 702.

Baseplates 800 of the switches 400, 402 can be coupled with (e.g., screwed down onto) the heat sink 702. The heat sink 702 includes several spaced-apart fins 704 that allow air to flow between the fins 704 and beneath the phase module assembly 114. In the perspective of FIG. 7, the fins 704 are elongated in up-and-down directions and are spaced apart in lateral or side-to-side directions. Air can enter the heat sink 702 (e.g., enter the spaces between the fins 704) from the back (e.g., from the top side of FIG. 7) from a backside plenum and flow through the finned channels in the heat sink 702 toward the front (e.g., the bottom side of FIG. 7). The hot air between the fins 704 exits from the front through ducted outputs to the outside of a cabinet where the stack 200 is placed. Seals can be provided to avoid air leaks at the back and front sides where air comes in and goes out. In one embodiment, current flows (or is conducted) in the busbar 500 of the phase module assembly 114 in a direction that is orthogonal to the directions in which air flows between the fins 704 in the heat sink 702.

The phase module assembly 114 can include an electrical interface that adapts logical signals from a controller to voltage signals needed to switch on and off the switches 400, 402 with adequate transients (e.g., this provides the functionality of a multi-switch gate driver). In one embodiment, each of the switches 400, 402 can include or represent a gate driver. Each of the switches 400, 402 are disposed side-by-side through interconnecting harnesses that are screwed to control terminals of the switches 400, 402. The switches 400, 402 can receive power supply and logic control signals, such as through fiber optic connectors.

Figure 10:
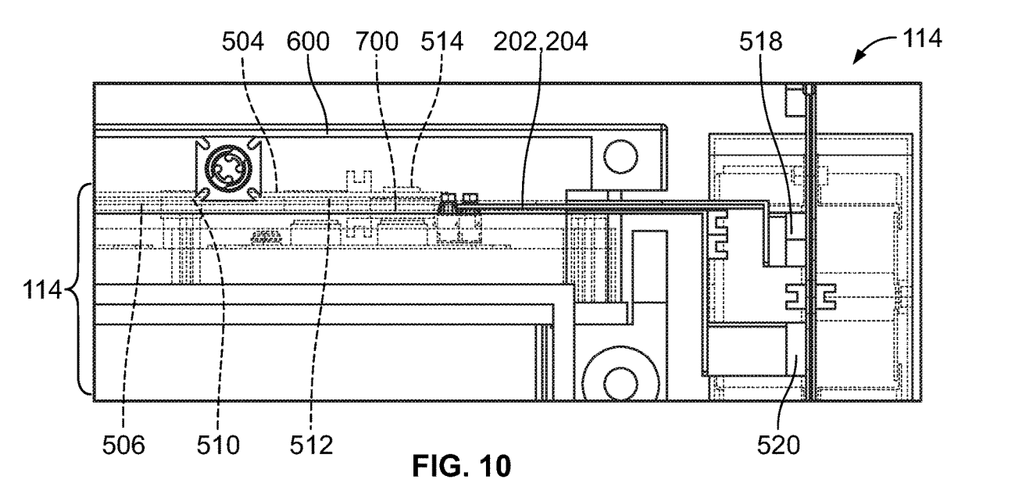
FIG. 10 illustrates a cross-sectional view of one embodiment of the phase module assembly shown in FIG. 1 disposed inside the exterior housing shown in FIG. 6.

FIG. 10 illustrates a cross-sectional view of one embodiment of the phase module assembly 114 disposed inside the exterior housing 600. The phase module assembly 114 can connect with the busbar 202 or 204 described above. For example, the plate 506 can be conductively coupled with one side of the busbar 202 or 204 and the switches 400, 402 can be conductively coupled with the opposite side of the busbar 202 or 204. The positive internal bushings 510 can conductively couple the plate 506 and the positive external bushings 518 with the busbar 202 or 204 to conduct the positive DC being conducted by the busbar 202 or 204. The negative internal bushings 512 can conductively couple the switches 400, 402 and the negative external bushings 520 with the busbar 202 or 204 to conduct the negative DC being conducted by the busbar 202 or 204.

Figure 11:
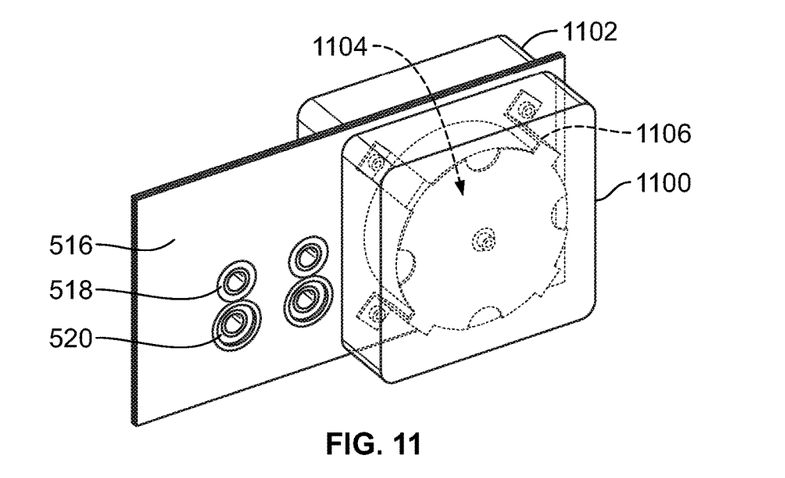
FIG. 11 illustrates a perspective view of one embodiment of a back side of a vertical busbar shown in FIG. 5.

One feature of the phase module assembly 114 is that the busbar 516 is shaped and positioned to avoid collision with capacitors placed inside boxes at the back of the vertical busbar 516. FIG. 11 illustrates a perspective view of one embodiment of a back side of the vertical busbar 516 shown in FIG. 5. The side of the busbar 516 shown in FIG. 11 is opposite of the side of the busbar 516 that is visible in FIGS. 6 and 7.

The busbar 516 includes two capacitor boxes 1100, 1102 on each side of the busbar 516. The capacitor boxes 1100, 1102 house a capacitor 1104 that are conductively coupled with the busbar 516 by several feet 1106. The boxes 1100, 1102 form exterior housings that protect the capacitor 1104 located therein. The capacitors 1104 can be a low inductance capacitor. The capacitor 1104 can be a wound foil capacitor or another type of capacitor.

The capacitor 1104 can be a low inductance capacitor when the entire flat vertical busbar 516 with the capacitor 1104 behaves as a commutation capacitor for the switches. For example, for IHM 19×14 modules, 3.3 kV blocking, and four mounted capacitors 1104, each capacitor 1104 may be less than 50 nH. Alternatively, the low inductance capacitors 1104 may have inductances of less than 50 µH or less than 50 mH. The boxes 1100, 1102 may not alone guarantee a perfect protected environment for the capacitors 1104 over time. An insulation barrier can be added to improve on the sealing of the boxes 1100, 1102 to reduce or prevent creepage failures.

As also shown in FIG. 11, the capacitors 1104 may include conductive crowns 1200 that project in opposite directions from the vertical busbar 516. Although only one crown 1200 is visible in FIG. 11, another crown 1200 may be disposed on and project from the opposite side of the vertical busbar 516.

The crowns 1200 may have cylindrical shapes. Each of the conductive crowns 1200 can be conductively coupled with the vertical busbar 516 by conductive feet 1106. The conductive feet 1106 can conductively couple the crown 1200 with the conductive busbar or plate 506, while other conductive feet can conductively couple the other crown 1200 with the busbar or plate 506. One crown 1200 is coupled to one side of the vertical busbar 516, while the other crown is coupled to the opposite side of the vertical busbar 516. Each conductive foot can be an L-shaped (or other shape) body that is fastened to the vertical busbar 516 (e.g., by fasteners, such as a bolt or screw) and that is coupled with one of the crowns.

The capacitors 1104 include dielectric bodies disposed between the conductive crowns and the vertical busbar. For example, one dielectric body is located between one crown and one side of the vertical busbar, while another dielectric body is located between the other crown and the opposite side of the vertical busbar. The combination of the dielectric bodies between the crowns forms two capacitors, with one capacitor on each side of the busbar. For example, one capacitor can be formed by one crown and the conductive plate, which are not conductively coupled with each other but are separated from each other by one of the dielectric bodies. The other capacitor can be formed by the other crown and the conductive plate, which also are not conductively coupled with each other but are separated from each other by the other dielectric body.

The current conducted in or by the busbar or plate 506 can be conducted into each of the crowns, which are separated from each other by the dielectric bodies. The busbar or plate can include plural planar conductors, e.g., laminated conductive plates. One of these can operate or act as a ground plate or ground reference of the capacitor. For example, current conducted in or through one laminated plate (e.g., which is coupled with the collector of the switch 400) can be conducted into the crowns in each capacitor, and the current conducted in or through another laminated plate (e.g., which is coupled with the emitter of the switch 400 and the collector of the switch 402) can be conducted with the other crown. This forms a capacitor that is integrated into the structure of the busbar and does not require separate connections with the switches 400, 402. Alternatively, the capacitors can form a single capacitor. For example, one laminated plate can be conductively coupled with one crown (e.g., by the feet 1106), while the other laminated plate is conductively coupled with the other crown.

Figure 12:
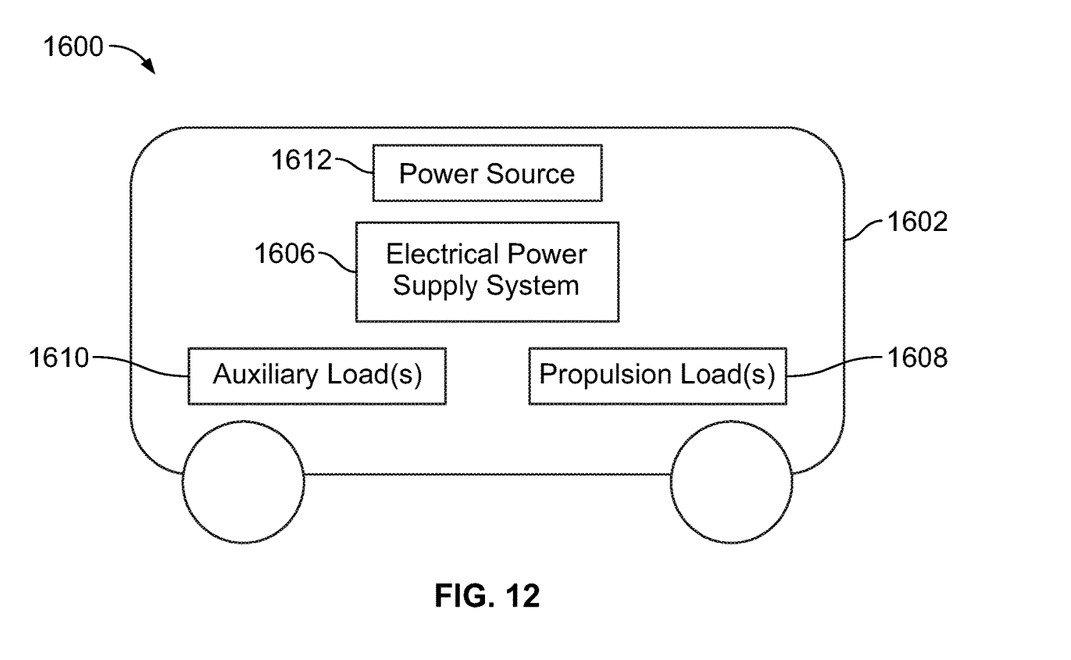
FIG. 12 is a schematic illustration of a vehicle.

FIG. 12 is a schematic illustration of a vehicle 1600. The vehicle can include one or more embodiments of the electrical power system that are described herein. The vehicle includes a body 1602, such as a vehicle chassis, hull, frame, or the like, that supports components, cargo, and passengers of the vehicle as the vehicle moves along one or more routes. While the vehicle is shown as a land-based vehicle having wheels, alternatively, the vehicle can represent a marine vessel. An electrical power supply system 1606 represents one or more of the electrical power systems described herein, and is located onboard the body of the vehicle. The body also supports one or more propulsion loads 1608, such as one or more traction motors that rotate wheels of the vehicle, one or more motors that rotate a propeller of the vehicle, or the like. Optionally, the body supports one or more auxiliary loads 1610, such as loads that do not perform work to propel the vehicle. The propulsion load(s) can represent one or more of the loads 310. A power source 1612 onboard the vehicle body can represent the power source 304. The electrical power system can operate as described herein to convert DC from the power source into AC that powers one or more of the propulsion loads and/or auxiliary loads.

In embodiments, the vehicle may be relatively large, such as a 50 ton, 100 ton, 250 ton, or 400+ ton mining haul truck, or a 40+ ton bollard pull tug boat. The inverter and/or electrical power system may be configured to output, in at least one mode of operation, from 10 kW to 3000 kW, or more. This reflects that in embodiments, the power system or inverter includes relatively large, high-power electronic components (power transistors or the like) that operate at relatively high power levels (tens of amperes and hundreds of volts or more), for powering large loads (e.g., traction motors) for propulsion of vehicles of this magnitude. In one aspect, the term "haul vehicle" refers to a vehicle with at least a 50 ton hauling capacity (land) or 40 ton bollard pull (marine).

In one embodiment, a phase module assembly of a multi-phase inverter is provided. The assembly includes a first flat laminated busbar elongated along a first direction, including a positive layer, a negative layer, and a load layer configured to be conductively coupled with a load. The first flat laminated busbar includes internal positive and negative terminal connectors for connecting the first flat laminated busbar to a second laminated flat busbar. The second laminated flat busbar includes positive and negative layers extending in a plane that is orthogonal to the first direction of the first laminated flat busbar. The second laminated flat busbar includes external positive and negative bushings configured to be conductively coupled with a power source of direct current. The internal positive and negative terminal connectors are conductively coupled with the external positive and negative bushings to receive the direct current from the power source. The assembly also includes one or more transistors conductively coupled with the internal positive and negative terminal connectors and configured to convert the direct current into one phase of a multi-phase alternating current of the multi-phase inverter, and to output the phase of the multi-phase alternating current to the load. The assembly also includes one or more capacitors conductively coupled with the internal positive and negative terminal connectors and with the external positive and negative bushings configured to be conductively coupled with the power source of direct current.

Optionally, the one or more capacitors are mechanically mounted on the second flat busbar.

Optionally, the one or more capacitors are one or more low inductance capacitors.

Optionally, the external positive and negative bushings are symmetrically arranged to one side of the one or more capacitors.

Optionally, each of the one or more capacitors includes a conductive crown coupled with the second flat busbar by one or more conductive feet and a dielectric body disposed between the conductive crown and the second flat busbar.

Optionally, each of the one or more conductive feet is an L-shaped body that is fastened to the second flat busbar and is coupled with the conductive crown of the corresponding capacitor.

Optionally, the first flat laminated busbar is coupled with a heat sink configured to be disposed between the first flat laminated busbar and a switch to which the internal positive and negative terminal connectors are coupled Optionally, the heat sink includes elongated fins arranged to direct airflow between the fins in directions that are perpendicular to directions in which current is conducted within the positive and negative layers of the first flat laminated busbar.

Optionally, the assembly also includes one or more switches and a housing that encloses the first flat laminated busbar, the one or more switches, and the heat sink.

Optionally, the first flat laminated busbar includes a bent tab disposed at an end of the first flat laminated busbar that is opposite of an end of the first flat laminated busbar that is coupled with the second flat laminated busbar.

Optionally, the bent tab is configured to be conductively coupled with the load.

In one embodiment, a multi-phase inverter assembly includes two or more of the phase modules conductively coupled with the power source to separately receive different portions of the direct current and to separately generate different phases of the multi-phase alternating current for the load.

Optionally, the two or more phase modules are coupled with a joining busbar that is configured to be conductively coupled with one or more bulk capacitors and one or more external cables of the power source.

In one embodiment, a multi-phase inverter stack includes the multi-phase inverter assembly, and the joining busbar.

In one embodiment, a power supply system includes a plurality of the multi-phase inverter stacks.

Optionally, the power supply system also includes an interconnecting lamination coupled with one or more of a top one of the multi-phase inverter assembly of the multi-phase inverter stacks, a bottom one of the multi-phase inverter assembly of the multi-phase inverter stacks, or the joining busbar.

Optionally, the load includes one or more of a vehicle brake resistor or a vehicle motor.

In one embodiment, a vehicle is provided that includes a chassis or hull, and a vehicle electrical power system operably disposed onboard the chassis or hull. The power system includes a vehicle electrical load that comprises at least one of a vehicle motor or a braking resistor. The power system also includes a phase module assembly of a multi-phase inverter. The phase module assembly includes a first flat laminated busbar elongated along a first direction, including a positive layer, a negative layer, and a load layer configured to be conductively coupled with the load. The first flat laminated busbar includes internal positive and negative terminal connectors for connecting the first flat laminated busbar to a second laminated flat busbar. The second laminated flat busbar includes positive and negative layers extending in a plane that is orthogonal to the first direction of the first laminated flat busbar. The second laminated flat busbar includes external positive and negative bushings configured to be conductively coupled with a power source of direct current. The internal positive and negative terminal connectors are conductively coupled with the external positive and negative bushings to receive the direct current from the power source. The phase module assembly also includes one or more insulated gate bipolar transistors conductively coupled with the internal positive and negative terminal connectors and configured to convert the direct current into one phase of a multi-phase alternating current of the multi-phase inverter, and to output the phase of the multi-phase alternating current to the load. The phase module assembly also includes one or more capacitors conductively coupled with the internal positive and negative terminal connectors and with the external positive and negative bushings configured to be conductively coupled with the power source of direct current.

Optionally, the one or more capacitors are mechanically mounted on the second flat busbar Optionally, the one or more capacitors are one or more low inductance capacitors.

Optionally, the external positive and negative bushings are symmetrically arranged to one side of the one or more capacitors.

Optionally, each of the one or more capacitors includes a conductive crown coupled with the second flat busbar by one or more conductive feet and a dielectric body disposed between the conductive crown and the second flat busbar.

Optionally, each of the one or more conductive feet is an L-shaped body that is fastened to the second flat busbar and is coupled with the conductive crown of the corresponding capacitor.

Optionally, the first flat laminated busbar is coupled with a heat sink configured to be disposed between the first flat laminated busbar and a switch to which the internal positive and negative terminal connectors are coupled.

Optionally, the heat sink includes elongated fins arranged to direct airflow between the fins in directions that are perpendicular to directions in which current is conducted within the positive and negative layers of the first flat laminated busbar.

Optionally, the vehicle also includes one or more switches and a housing that encloses the first flat laminated busbar, the one or more switches, and the heat sink.

Optionally, the first flat laminated busbar includes a bent tab disposed at an end of the first flat laminated busbar that is opposite of an end of the first flat laminated busbar that is coupled with the second flat laminated busbar.

In one embodiment, a vehicle power supply system includes plural phase module assemblies each including a first flat laminated busbar elongated along a first direction, including a positive layer, a negative layer, and a load layer configured to be conductively coupled with a vehicle load. The first flat laminated busbar includes internal positive and negative terminal connectors for connecting the first flat laminated busbar to a second laminated flat busbar. The second laminated flat busbar includes positive and negative layers extending in a plane that is orthogonal to the first direction of the first laminated flat busbar. The second laminated flat busbar includes external positive and negative bushings configured to be conductively coupled with a vehicle power source of direct current. The internal positive and negative terminal connectors are conductively coupled with the external positive and negative bushings to receive the direct current from the power source. The phase module assemblies also include one or more insulated gate bipolar transistors conductively coupled with the internal positive and negative terminal connectors and configured to convert the direct current into one phase of a multi-phase alternating current of the multi-phase inverter, and to output the phase of the multi-phase alternating current to the load. The phase module assemblies also include one or more capacitors conductively coupled with the internal positive and negative terminal connectors and with the external positive and negative bushings configured to be conductively coupled with the power source of direct current. The phase module assemblies are conductively coupled with the power source to separately receive different portions of the direct current and to separately generate different phases of the multi-phase alternating current for the load.

Optionally, the phase module assemblies are coupled with a joining busbar that is configured to be conductively coupled with one or more bulk capacitors and one or more external cables of the power source.

In one embodiment, a vehicle power supply system includes plural phase module assemblies each including a first flat laminated busbar elongated along a first direction, including a positive layer, a negative layer, and a load layer configured to be conductively coupled with a vehicle load. The first flat laminated busbar includes internal positive and negative terminal connectors for connecting the first flat laminated busbar to a second laminated flat busbar. The second laminated flat busbar includes positive and negative layers extending in a plane that is orthogonal to the first direction of the first laminated flat busbar. The second laminated flat busbar includes external positive and negative bushings configured to be conductively coupled with a vehicle power source of direct current. The internal positive and negative terminal connectors are conductively coupled with the external positive and negative bushings to receive the direct current from the power source. The phase module assemblies also include one or more insulated gate bipolar transistors conductively coupled with the internal positive and negative terminal connectors and configured to convert the direct current into one phase of a multi-phase alternating current of the multi-phase inverter, and to output the phase of the multi-phase alternating current to the load. The phase module assemblies also include one or more capacitors conductively coupled with the internal positive and negative terminal connectors and with the external positive and negative bushings configured to be conductively coupled with the power source of direct current. The phase module assemblies are conductively coupled with the power source to separately receive different portions of the direct current and to separately generate different phases of the multi-phase alternating current for the load. The phase module assemblies also include a joining busbar connecting the phase module assemblies and configured to be conductively coupled with one or more bulk capacitors and one or more external cables of the power source.

Optionally, the joining busbar is a laminated busbar located between the phase module assemblies.

Optionally, the load includes one or more of a vehicle brake resistor or a vehicle motor.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the inventive subject matter without departing from its scope. While the dimensions and types of materials described herein are intended to define the parameters of the inventive subject matter, they are by no means limiting and are exemplary embodiments. Many other embodiments will be apparent to one of ordinary skill in the art upon reviewing the above description. The scope of the inventive subject matter should, therefore, be determined with reference to the appended clauses, along with the full scope of equivalents to which such clauses are entitled. In the appended clauses, the terms "including" and "in which" are used as the plain-English equivalents of the respective terms "comprising" and "wherein." Moreover, in the following clauses, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose several embodiments of the inventive subject matter, including the best mode, and also to enable one of ordinary skill in the art to practice the embodiments of inventive subject matter, including making and using any devices or systems and performing any incorporated methods. The patentable scope of the inventive subject matter is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or operations, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "comprises," "including," "includes," "having," or "has" an element or a plurality of elements having a particular property may include additional such elements not having that property.

What is claimed is:

1. A vehicle comprising:
a chassis or hull; and
a vehicle electrical power system operably disposed onboard the chassis or hull, the power system comprising:
a vehicle electrical load, the load comprising at least one of a vehicle motor or a braking resistor; and
a phase module assembly of a multi-phase inverter, the phase module assembly comprising:
a first flat laminated busbar elongated along a first direction, including a first positive layer, a first negative layer, and a load layer configured to be conductively coupled with the load, the first flat laminated busbar including internal positive and negative terminal connectors for connecting the first flat laminated busbar to a second flat laminated busbar, the second flat laminated busbar including a second positive layer and a second negative layer extending in a plane that is orthogonal to the first direction of the first flat laminated busbar, the second flat laminated flat busbar including external positive and negative bushings configured to be conductively coupled with a power source of direct current,
wherein the internal positive and negative terminal connectors are conductively coupled with the external positive and negative bushings to receive the direct current from the power source;
one or more transistors conductively coupled with the internal positive and negative terminal connectors and configured to convert the direct current into one phase of a multi-phase alternating current of the multi-phase inverter, and to output the phase of the multi-phase alternating current to the load; and
one or more capacitors conductively coupled with the internal positive and negative terminal connectors, with the external positive and negative bushings, and configured to be conductively coupled with the power source of direct current.

2. The vehicle of claim 1, wherein the one or more capacitors are mechanically mounted on the second flat laminated busbar.

3. The vehicle of claim 1, wherein the one or more capacitors are one or more low inductance capacitors.

4. The vehicle of claim 1, wherein the external positive and negative bushings are symmetrically arranged to one side of the one or more capacitors.

5. The vehicle of claim 1, wherein each of the one or more capacitors includes a conductive crown coupled with the second flat laminated busbar by one or more conductive feet, a dielectric body disposed between the conductive crown and the second flat laminated busbar, and a ring-shaped insulation barrier around the dielectric body and disposed between the one or more conductive feet and the dielectric body of the corresponding capacitor.

6. The vehicle of claim 5, wherein each of the one or more conductive feet is an L-shaped body that is fastened to the second flat laminated busbar and is coupled with the conductive crown of the corresponding capacitor.

7. The vehicle of claim 1, wherein the first flat laminated busbar is coupled with a heat sink configured to be disposed between the first flat laminated busbar and a switch to which the internal positive and negative terminal connectors are coupled.

8. The vehicle of claim 7, wherein the heat sink includes elongated fins arranged to direct airflow between the fins in directions that are perpendicular to directions in which the direct current is conducted within the first positive layer and the first negative layer of the first flat laminated busbar.

9. The vehicle of claim 7, further comprising one or more switches and a housing that encloses the first flat laminated busbar, the one or more switches, and the heat sink.

10. The vehicle of claim 1, wherein the first flat laminated busbar includes a bent tab disposed at an end of the first flat laminated busbar that is opposite of an end of the first flat laminated busbar that is coupled with the second flat laminated busbar.

11. The vehicle of claim 1, wherein the vehicle is a haul vehicle.

12. A vehicle power supply system comprising:
plural phase module assemblies each including:

a first flat laminated busbar elongated along a first direction, the first flat laminated busbar including a first positive layer, a first negative layer, and a load layer configured to be conductively coupled with a vehicle load, the first flat laminated busbar including internal positive and negative terminal connectors for connecting the first flat laminated busbar to a second flat laminated busbar, the second flat laminated busbar including a second positive layer and a second negative layer extending in a plane that is orthogonal to the first direction of the first flat laminated busbar, the second flat laminated busbar including external positive and negative bushings configured to be conductively coupled with a vehicle power source of direct current, wherein the internal positive and negative terminal connectors are conductively coupled with the external positive and negative bushings to receive the direct current from the power source;

one or more transistors conductively coupled with the internal positive and negative terminal connectors and configured to convert the direct current into one phase of a multi-phase alternating current of a multi-phase inverter, and to output the phase of the multi-phase alternating current to the load; and one or more capacitors conductively coupled with the internal positive and negative terminal connectors, with the external positive and negative bushings, and configured to be conductively coupled with the power source of direct current, wherein the phase module assemblies are conductively coupled with the power source to separately receive different portions of the direct current and to separately generate different phases of the multi-phase alternating current for the vehicle load.

13. The vehicle power supply system of claim 12, wherein the phase module assemblies are coupled with a joining busbar that is configured to be conductively coupled with one or more bulk capacitors and one or more external cables of the power source.

14. The vehicle power supply system of claim 13, wherein the vehicle load is a traction motor for a haul vehicle.

15. A vehicle power supply system comprising:
plural phase module assemblies each including:
a first flat laminated busbar elongated along a first direction, the first flat laminated busbar including a first positive layer, a first negative layer, and a load layer configured to be conductively coupled with a vehicle load, the first flat laminated busbar including internal positive and negative terminal connectors for connecting the first flat laminated busbar to a second laminated flat busbar, the second laminated flat busbar including a second positive layer and a second negative layer extending in a plane that is orthogonal to the first direction of the first flat laminated busbar, the second flat laminated busbar including external positive and negative bushings configured to be conductively coupled with a vehicle power source of direct current, wherein the internal positive and negative terminal connectors are conductively coupled with the external positive and negative bushings to receive the direct current from the power source;

one or more transistors conductively coupled with the internal positive and negative terminal connectors and configured to convert the direct current into one phase of a multi-phase alternating current of a multi-phase inverter, and to output the phase of the multi-phase alternating current to the vehicle load; and one or more capacitors conductively coupled with the internal positive and negative terminal connectors, with the external positive and negative bushings, and configured to be conductively coupled with the power source of direct current, wherein the phase module assemblies are conductively coupled with the power source to separately receive different portions of the direct current and to separately generate different phases of the multi-phase alternating current for the load; and a joining busbar connecting the phase module assemblies and configured to be conductively coupled with one or more bulk capacitors and one or more external cables of the power source.

16. The vehicle power supply system of claim 15, wherein the joining busbar is a laminated busbar located between the phase module assemblies.

17. The vehicle power supply system of claim 15, wherein the vehicle load includes one or more of a vehicle brake resistor or a vehicle motor.

18. The vehicle power supply system of claim 15, wherein the vehicle load is a traction motor for a haul vehicle.

* * * * *